US007640795B2

(12) United States Patent  (10) Patent No.: US 7,640,795 B2
Raichle  (45) Date of Patent: Jan. 5, 2010

(54) APPARATUS AND METHOD FOR STARTER RPM DETECTION

(75) Inventor: Kurt Raichle, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 10/323,805

(22) Filed: Dec. 20, 2002

(65) Prior Publication Data

US 2004/0118194 A1  Jun. 24, 2004

(51) Int. Cl.
*G01M 19/02* (2006.01)
(52) U.S. Cl. .................................. 73/114.62
(58) Field of Classification Search ............... 73/118.1, 73/114.39, 114.62
See application file for complete search history.

(56) References Cited

U.S. PATENT DOCUMENTS

| 2,579,804 | A | * | 12/1951 | Dotson | 73/116 |
| 2,862,391 | A | * | 12/1958 | Schneider et al. | 74/7 R |
| 3,845,375 | A | * | 10/1974 | Stiebel | 318/463 |
| 3,903,737 | A | * | 9/1975 | Burden et al. | 73/118.1 |
| 4,310,888 | A | * | 1/1982 | Furuhashi et al. | 701/113 |
| 4,325,265 | A | * | 4/1982 | Wakatsuki et al. | 74/7 R |
| 4,948,997 | A | * | 8/1990 | Ohmitsu et al. | 310/113 |
| 5,089,759 | A | * | 2/1992 | Miotke et al. | 318/568.11 |
| 5,195,366 | A | * | 3/1993 | Duncan | 73/118.1 |
| 5,475,270 | A | * | 12/1995 | McRoy | 307/10.6 |
| 5,601,058 | A | * | 2/1997 | Dyches et al. | 123/179.2 |
| 5,691,871 | A | * | 11/1997 | Innes | 361/96 |
| 6,653,807 | B2 | * | 11/2003 | Saito et al. | 318/430 |
| 7,212,911 | B2 | * | 5/2007 | Raichle et al. | 701/114 |
| 7,218,010 | B2 | * | 5/2007 | Albertson et al. | 290/38 R |
| 7,284,416 | B2 | * | 10/2007 | Krampitz et al. | 73/119 R |

* cited by examiner

*Primary Examiner*—Lisa M Caputo
*Assistant Examiner*—Octavia Davis
(74) *Attorney, Agent, or Firm*—Baker & Hostetler LLP

(57) ABSTRACT

An engine starter motor tester applies power to a motor under test at the level normally applied while that motor is installed in a vehicle and monitors the ripple in the driving current. The ripple rate, scaled by the number of windings used in the construction of the motor, provides a direct reading of the shaft speed of the unloaded motor. This number allows a valid inference concerning the state of health of the motor, and is more certain than an estimate for an unloaded motor based on operator experience and motor "sound". A complete test apparatus includes a stored lookup table, allowing the user to key in a product brand and model number and read directly both the RPM and the test apparatus's rating of the motor under test, expressed in terms such as percentage of life remaining.

27 Claims, 6 Drawing Sheets

APPARATUS AND METHOD FOR STARTER RPM DETECTION

FIELD OF THE INVENTION

The present invention relates generally to vehicular and non-vehicular engine starter motor test equipment. More particularly, the present invention relates to an apparatus and method for testing a starter motor by measurement of rotational speed under power.

BACKGROUND OF THE INVENTION

Engine-powered vehicles, recreational equipment, and machines commonly use battery-powered electric motors to start their engines. Such starter motors have a variety of failure modes. A typical maintenance procedure when starter motor failure is suspected involves removing the motor and testing it using dedicated test equipment. Such a unit of test equipment typically consists of a bracket to which the motor under test can be clamped, a wall-plug-AC-powered DC power supply, heavy-duty cables to feed the power to the motor under test, and a variety of connection and control schemes to allow any of the various styles of starter motors to be actuated in a way similar to their normal on-engine actuation modes.

In pursuit of minimization of complexity and component cost, typical starter motor testers employ simple power supplies and provide no direct indication of the condition of the starter motor, relying on the experience of the operating technician to decide whether the sound of the running starter motor is "about right". While effective for diagnosing simple failures such as worn-out brushes, shorted commutators, open field windings, and failed hold coils, and to verify that a replacement starter motor acts nominally as part of a sales transaction, such tester designs may fall short when testing newer starters. For example, recent starter motor designs can differ greatly, so that technician experience may be less reliable as a guide to motor condition. Meanwhile, starter motors for fossil/renewable hybrid and low emissions vehicles may be used at virtually every vehicle stop, so demands for starter motor reliability and durability can increase, which can in turn dictate a need for higher analytical precision in a tester. Conventional tester designs may also fail to take advantage of recent innovations in electronic components and concepts that promise significant benefits, including the capability to detect failure modes that may be partially masked when starter motors are run without a load.

Incorporating into a starter motor tester the capability to apply a mechanical load simulating an engine sized for each motor has presented disadvantages. The variety of dimensions of run-away clutches, as well as the variety of mounting bracket styles used to affix starter motors to engines, makes the mechanical connection of a starter to a load simulator a significant challenge. Such a load simulator, in turn, would have significant technical challenges to its implementation in support of all likely engine types, from motorcycles to heavy trucks. Temperature testing to verify a starter motor's ability to function in a worst case would be desirable, but would require chilling the starter motor to simulate extreme winter conditions, which presents the disadvantage of complexity.

Accordingly, there is a need in the art for a starter motor tester that provides increased test capability compared to conventional designs.

SUMMARY OF THE INVENTION

A preferred embodiment of a starter motor tester comprises a mechanical clamping apparatus to restrain a motor under test from rotating during startup and slowdown; an electrical circuit to apply power to the starter motor; a detector circuit to sense the rate at which the starter motor spins; a current monitor circuit to detect the instantaneous current flowing through the motor under test; a current scaler to convert the detected level to a form usable by the test circuitry; a rate sense function to detect the ripple frequency of the load current; a rate scaler to adjust the signal from the rate sense circuit according to the properties of the motor under test; a display driver circuit to convert the scaled rate signal to a human-readable form; and a display to report the detected spin rate (commonly termed RPM in reference to the standard unit of measure, revolutions per minute).

In accordance with another embodiment of the present invention, an apparatus for performing starter motor testing tasks establishes electrical connection between a suitable source of DC power and a starter motor being tested and applies that DC power to the motor. It further applies control signals to the starter motor, senses the current level drawn by the starter motor, and detects pulsation in the sensed starter motor current level attributable to addition and removal of individual motor windings from the power circuit as the motor's brushes make and break contact with the individual segments of the motor's armature. It further converts detected pulses into a pulse rate indication, adjusts the pulse rate indication based on properties of the individual starter motor in order to determine the RPM of the starter motor under test, and displays as an output the sensed and scaled RPM of the starter motor under test.

In accordance with another embodiment of the present invention, a method for testing vehicle engine starter motors features the steps of accepting AC input power from public utility AC mains; converting the incoming AC input power to DC at the range of levels of voltage and current required for operating engine starter motors; applying the DC to the starter motor under test; sensing the average and transient current of the power applied to the starter motor under test; converting the ripples in the sensed current level to a ripple rate; scaling the ripple rate signal based on the number of windings and/or any gear reduction characteristic of the starter motor under test to yield an effective RPM value; displaying the effective RPM value in human-readable form; displaying a summary indication of the condition of the starter motor under test; and providing electrical connectivity to integrate the starter motor testing method and the starter motor under test.

There have thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments, and of being practiced and carried out in various ways. It is also to be understood that the phraseology and terminology employed herein, as well as the abstract, are for the purpose of description, and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

A preferred embodiment of the invention provides a vehicle engine starter motor tester that includes a safety clamp to restrain the motor from moving during testing. A power source applies the equivalent of vehicle battery power to a subject motor. Interconnect cables, clamps, and switching circuitry allow multiple styles of conventional starter motors to be powered. A current monitor senses and displays the draw of the subject motor for comparison to the standard for that motor. Also, in the preferred embodiment of the invention, a detector and its associated circuitry sense and display motor RPM during the test.

Figure 1:
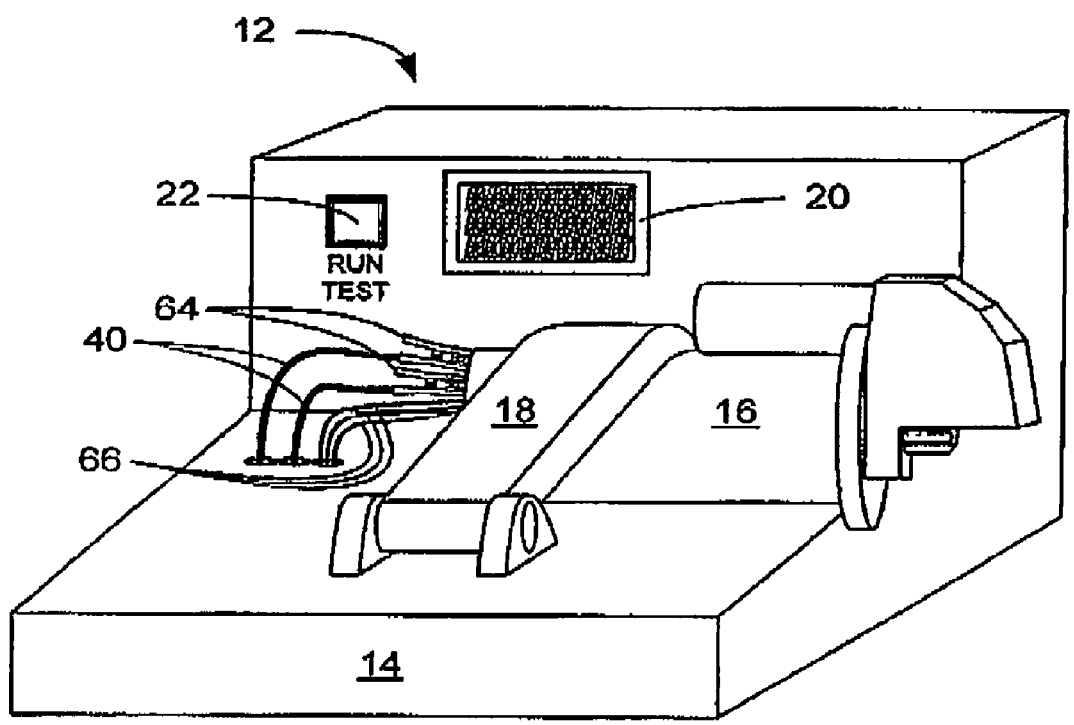
FIG. 1 is a perspective view of a mechanical arrangement suitable for implementing the preferred embodiment of a starter motor tester.

FIG. 1 shows a starter motor test set 12 that encloses the electronics in a simple housing 14 and restrains a starter 16 under test with a clamp 18. The test results are displayed on a readout display 20. The test set requires few or no controls on the panel; the preferred embodiment can use a simple test command pushbutton 22 to run the test. The power cables 40 and the associated power cable clamps 66 provide connection for primary power. Additional interconnecting wires 68 support whatever additional signals may be required for testing a specific type of starter motor.

Figure 2:
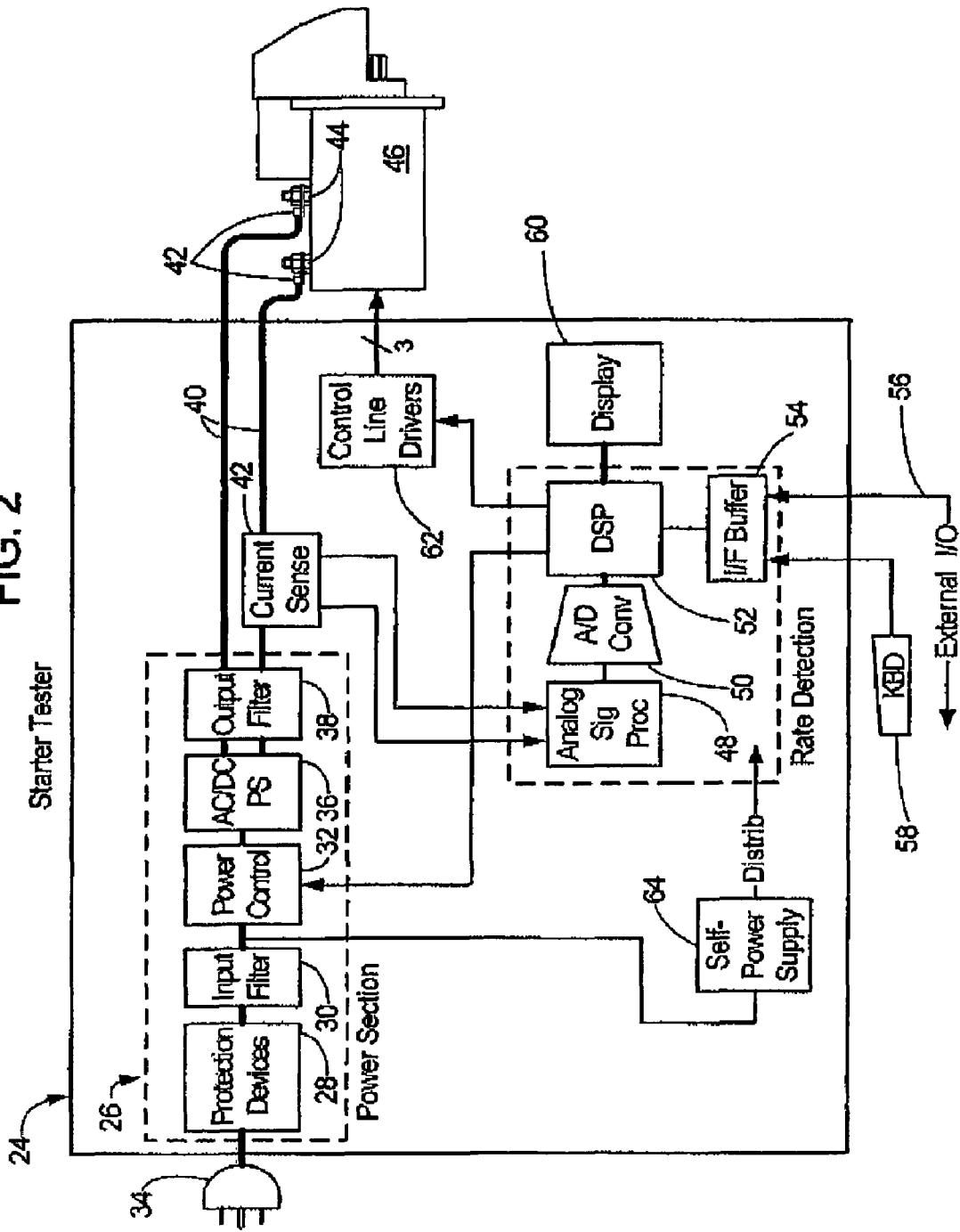
FIG. 2 is a block diagram illustrating a starter motor tester that incorporates an RPM sensor according to a preferred embodiment of the present invention.

FIG. 2 illustrates a preferred embodiment of the present inventive apparatus and method in block diagram form. Within a starter motor tester 24, a power supply 26 that uses a protection function 28, an electromagnetic interference (EMI) filter 30, and a main power switching device 32, draws power from AC mains by a standard electrical plug 34 and provides the power to AC-to-DC conversion circuitry 36 and an output EMI filter 38.

The power supply output in the preferred embodiment provides low-resistance electrical continuity through a pair of power cables 40 and a series current sensing device 42 to the primary inputs 44 of the starter unit under test 46. The signal developed across the current sensing device 42 is subjected to analog signal level adjustment and filtering 48 to produce an isolated signal of suitable magnitude for processing by an analog-to-digital (A/D) converter 50 whose output digital data stream is fed to a digital signal processor (DSP) 52. The DSP 52 also receives data from additional digital data sources via an interface buffer 54; in this embodiment the additional sources include a Universal Serial Bus (USB®) port 56 that permits a lookup table of starter model numbers with selected characteristics of each to be downloaded into the tester from a remote source and a keyboard 58 that allows the user to enter characteristics for the starter type under test without depending on a remote source.

FIG. 2 also shows the output of the DSP 52 as a display 60 that indicates results of the testing, for instance expected RPM, actual RPM, and average current draw. In this preferred embodiment, the DSP 52 also supports the keyboard 58, and can be used to generate display information such starter motor data as model number, number of poles, gear reduction ratio, rated torque, and the like for presentation on the display 60.

As further illustrated in FIG. 2, a typical starter motor may have two main power conductors only (a first conductor in the form of a wire for "hot" and a second conductor in the form of ground return via the body of the starter is the minimum that can work; starters of this type as well as starters with two power wires can be supported using the preferred embodiment), or may have two main power conductors plus a varying number of additional wires; the configuration for a test depends on the number of additional components integrated into the starter unit under test 46. A driver circuit 62 in the tester 24 allows these additional functions in the starter under test to be exercised with excitation and loads comparable to those in the vehicle.

The AC/DC power supply could apply power to starters designed for so-called positive-ground systems as well as for negative-ground systems.

The electronic circuitry in the preferred embodiment may require a stand-alone power unit 64 isolated from the DC supply 26 used to energize the starter under test 46.

Figure 3:
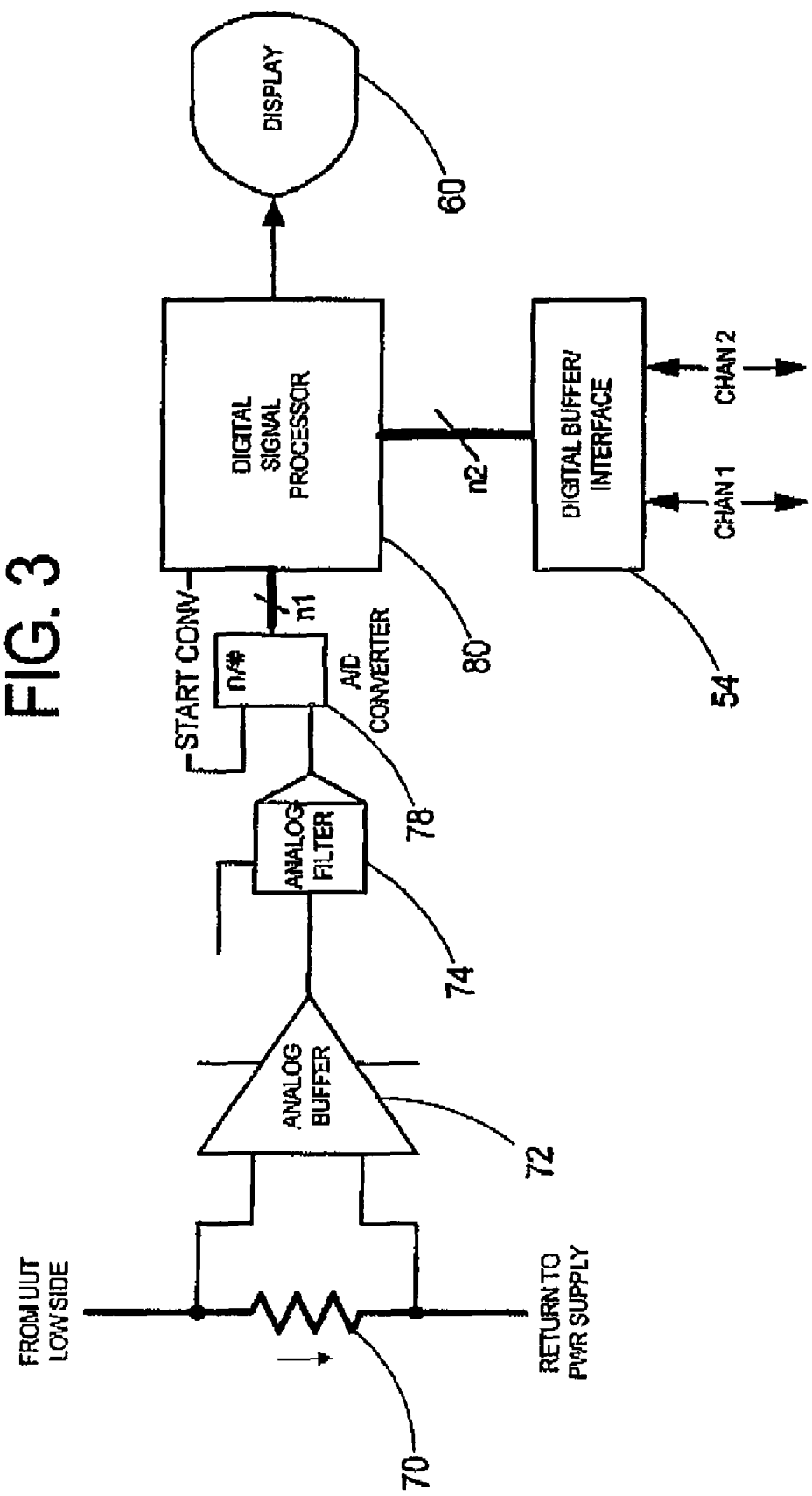
FIG. 3 is a first schematic diagram showing the sensor configuration used in the preferred embodiment of the invention, in which a return-line current monitor and differentiator are used to implement the RPM sense circuit.
Figure 4:
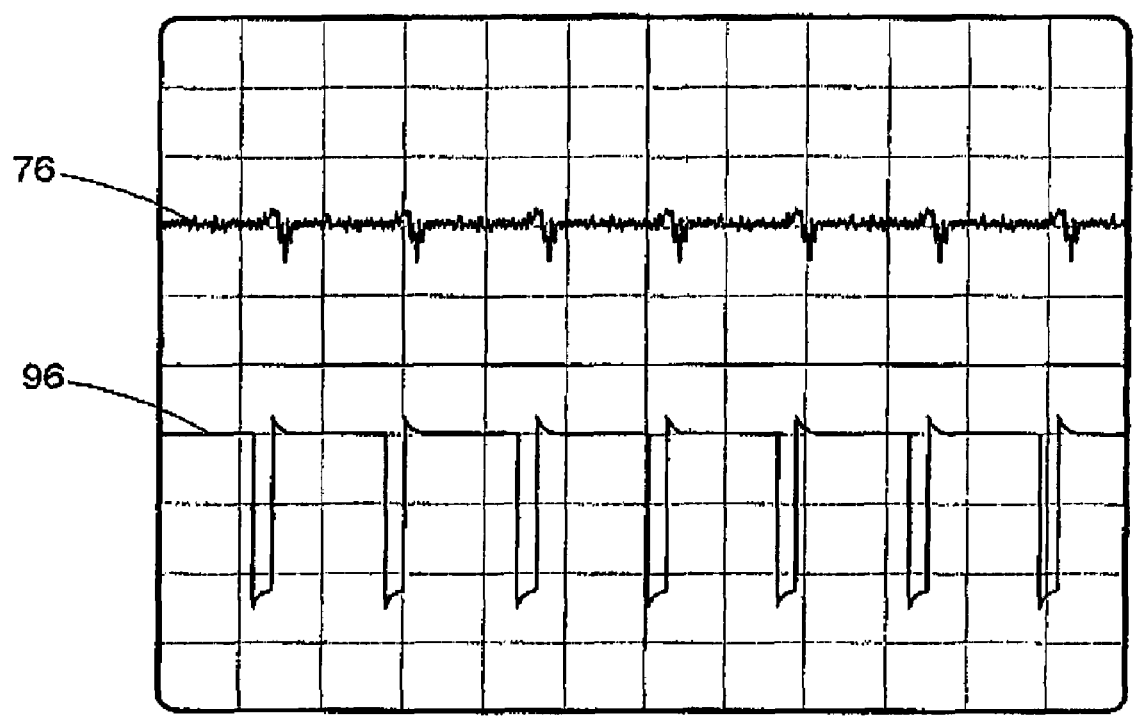
FIG. 4 is a "screen shot" representing an oscilloscope screen showing the waveforms characteristic of a signal from a current sensor and from a Hall effect probe operating at the same rate.

FIG. 3 shows a greater level of detail in the analog portion of the waveform analysis function. FIG. 4 shows waveforms characteristic of the circuit designs in FIG. 3 and FIG. 6, and will be referenced during the discussion of both of the latter figures. The voltage developed across a sense resistor 70 may require amplification and buffering with an isolating amplifier 72. The amplifier 72 output may require further conditioning with a bandpass filter 74 to remove the DC level and uncorrelated noise, such as high-frequency switching noise from the AC/DC converter 36 in FIG. 2. The filter 74 can thus yield a series of signal pulses associated with the powering of successive armature windings through the brushes in the starter under test 46 in FIG. 2.

FIG. 4 shows a representative waveform present in the current-sensor-based rate detection circuit as a waveform 76. The voltage signal represented by this waveform 76 may then be applied to an analog-to-digital converter (A/D) 78 to be digitized at a sufficient sampling rate to avoid aliasing, with the sample rate under appropriate control. The term "aliasing" is used here as normally used by those skilled in the art, namely to specify sampling at or above the Nyquist rate. In the case of a starter tester, the sample rate would ordinarily be either twice the highest known pole rate for an unloaded starter or a rate selected by the DSP 80 for each starter type, as preferred for a given implementation. Alternative designs may be used, such as analog systems feeding shaped pulse streams to stand-alone counter modules.

The waveform 76 thus sampled could contain a characteristic repetitive pattern. Analysis within the DSP 80 could in turn detect the pulse rate causing this pattern, which is the rate at which poles of the starter armature are successively energized by the starter motor's brushes. From that rate and the data characterizing the selected starter, the tester can determine the rotation rate of the armature under test. Since the value of interest is generally the armature rate rather than the output shaft rate, the armature pole rate may be used to indicate the condition of the starter under test. Output shaft rate may also be a datum of interest.

The DSP 80 in the preferred embodiment should be able to store, manage, and upgrade a database of starter properties in internal or external nonvolatile memory, such database of sufficient size to meet the normal requirements of the intended product market.

An example of an alternative technology usable in place of a DSP is a general-purpose field programmable gate array (FPGA). Some FPGAs can be programmed with sufficient functionality to perform the required operations, as well as to store a block of starter data in internal or external nonvolatile memory.

Another embodiment can use a unitized microcontroller, such as a member of the PIC® product family, to implement a significant part of the design described above. Typical PIC family devices include buffering and A/D conversion, but would likely require some external passive lowpass filtering to suppress aliasing, and would lack a large memory store to manage a starter database internal to the PIC. Thus, an implementation with a PIC could require an additional external nonvolatile memory store, and would likely yield an effective product complexity comparable to the previously described embodiments.

Figure 5:
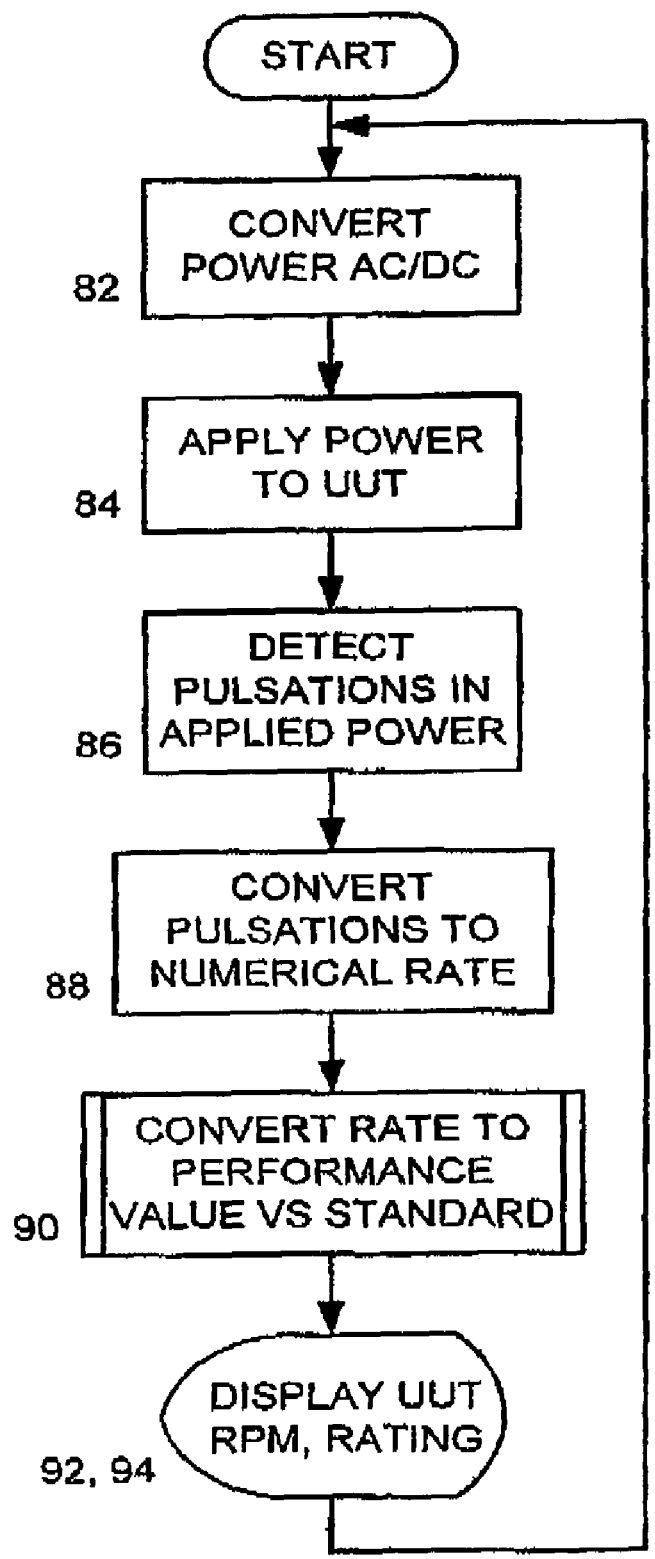
FIG. 5 provides a flowchart illustrating the steps performed by a preferred embodiment of a starter motor tester.

FIG. 5 illustrates another embodiment of the present inventive apparatus in flowchart form. This embodiment provides for conversion of mains AC to a DC level suitable for vehicle engine starter motors 82 and for application of this power to the motor under test 84 (UUT). The embodiment further detects pulsations in DC electric motor drive current 86, converts the pulsations to a numerical rate value 88, and converts this number to a corresponding motor performance value 90. The embodiment then displays the performance value 92, and rates 94 the motor under test compared to the standard for its type.

Additional manual or automatic capabilities, such as detection of the type of starter motor, determination of starter motor requirements, and furnishing of excitation requirements to motor drive circuitry, can be implemented to produce a complete commercial product.

A system according to the preferred embodiment of the invention may have other design elements, such as, for example, a housing, input electromagnetic interference (EMI) filter circuitry, output EMI filter circuitry, protection circuitry to provide circuit interruption in event of power fault, power factor correction, a user interface, a temperature monitor, and other design elements appropriate for industrial application of starter motor testing functions.

The preferred embodiment of the invention, in providing a built-in RPM scaling function, introduces a level of capability for precision whose benefit offsets the disadvantage of adding to system complexity. Similarly, the use of a digital readout to display RPM and/or other properties measured during the test, can provide information to allow a credible estimate of the performance capability of the unit under test compared to a new or ideal unit of the same type, rather than a simple go/no go observation.

Figure 6:
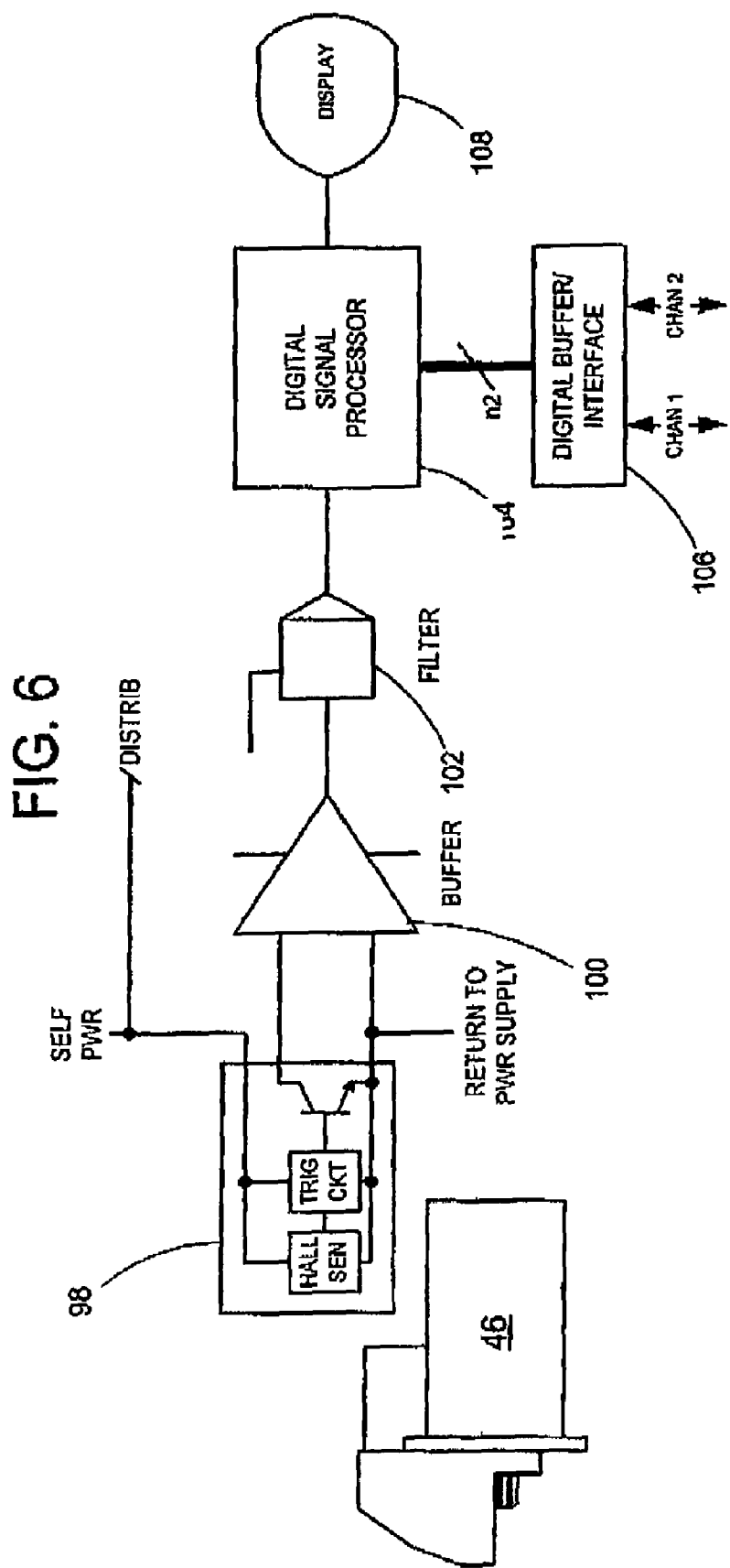
FIG. 6 is a second schematic diagram of an embodiment similar to FIG. 2 with the exception that a magnetic field sensor is employed in place of a current sensor.

Alternative embodiments can, for example, sense rotation rate directly by detecting changes in the magnetic field outside the starter during a test. FIG. 6 shows an example of such a sensor circuit using a Hall effect device. Placed proximate to a motor under test, a sensor based on a Hall effect device could detect changes in the motor's magnetic field as the armature rotates. This signal, suitably buffered 100 and filtered 102 using a circuit as illustrated in FIG. 6, could produce a waveform 96 as shown in FIG. 4. The Hall effect component 98 of the circuit of FIG. 6 could be an active sensor powered by the self power supply 64 shown in FIG. 2. Such a device, by directly producing a usable output signal as each armature pole passes, could simplify DSP 104 programming. Digital interface 106 signals and display 108 characteristics could be largely unaffected by the choice of sensor technology. There are still other existing sensing devices capable of producing accurate measurements.

Other alternative embodiments could include still other technologies for detecting motor speed by detecting current drawn by individual armature poles, such as an inductive current sensor, clamp-on DC ammeter, or the like, attached to or surrounding the DC power wiring, without deviating from the intent of the series resistor approach already described. Similarly, a motion detector for ferrous metals or a similar device, placed adjacent to the gear teeth of the starter motor drive mechanism, could directly sense output shaft motion, detecting the achieved rotation rate of the starter and permitting its display.

In a complete implementation of the present invention, certain of the steps making up the preferred embodiment could be performed using a computing device, stored memory system, binary data input, and a human interface for commands and signals.

The application of the inventive apparatus in the testing of motors manufactured for use in starting internal combustion engines in vehicles does not exclude its further application for testing other types of motors, such as those used for starting internal combustion engines used for powering generators, pumps, and other stationary and portable equipment, as well as other motor types that use DC power and provide intermittent or continuous service. The features of the inventive apparatus are further applicable to testing of motors powered from AC.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described; accordingly, all suitable modifications and equivalents may be resorted to, that fall within the scope of the invention.

What is claimed is:

1. A tester for vehicle engine starter motors, comprising:
   a mechanical clamping apparatus to restrain a motor under test from rotating during startup and slowdown;
   an electrical circuit to apply power to the starter motor;
   a data storage capability allowing entered data characterizing a plurality of starter motor types to be retained within said starter tester;
   a data selection device allowing a single starter motor type to be selected from entered data;

a detector circuit to sense the rate at which the starter motor spins and comparing with a standard spin rate of a motor of the same type; and a display to report the detected spin rate and the comparison with the standard spin rate.

2. The tester of claim 1, wherein said detector circuit further comprises:

a current monitor circuit to detect the instantaneous current flowing through the motor under test; and a current scaler to convert the detected motor drive current to an electrical signal characterized by transient signal components associated with starter motor armature rotation.

3. The tester of claim 1, wherein said detector circuit further comprises:

a magnetic field detection device (MFDD) external to the motor under test to produce a sensible response to transient starter motor magnetic field effects; and an MFDD interface circuit to convert the sensible response from the MFDD to a form usable by the display circuitry.

4. The tester of claim 1, wherein said detector circuit further comprises:

a rate sense function to detect the ripple frequency of the load current;

a rate scaler to adjust the signal from the rate sense circuit according to the properties of the motor under test; and a display driver circuit to convert the scaled rate signal to a form compatible with a display device.

5. The tester of claim 1, wherein said electrical circuit to apply power further comprises:

an input circuit configured to accept alternating current input power from public utility alternating current mains; and a power supply to convert input alternating current to low-voltage direct current suitable for application to a starter motor under test.

6. The tester of claim 5, wherein said power source supports testing of 6-volt, 12-volt, and 24-volt starter motors.

7. The tester of claim 5, wherein said power source supports positive-ground electrical systems.

8. The tester of claim 1, further comprising:

a data entry device to furnish data characterizing a plurality of starter motor types to said starter tester; and a processing device to apply controlling values to the scaling circuit of said starter motor tester based on information extracted from entered data.

9. The tester of claim 8, wherein said data entry capability further comprises:

a first data entry capability that permits entry of a store of information identifying starter motors by model designation associated with such properties of each model as may be relevant to the testing; and a second data entry capability that permits entry into the tester of type identification for the specific starter motor under test.

10. The tester of claim 8, wherein said system supports manual entry of test parameters.

11. The tester of claim 8, wherein the data entry device including entry of standard values for the motor, stored in the data storage, and processed by the processing device for comparison of the standard values with the detected values of the motor.

12. The tester of claim 1, further comprising an auxiliary power circuit configured to provide, from a source external to said tester, power to the electronic circuitry of the tester.

13. The tester of claim 1, further comprising a set of devices to provide electrical connection between the test apparatus and the starter motor under test.

14. The tester of claim 13, wherein said electrical connection devices support a connection that simulates the in-vehicle connection from the vehicle battery to the starter motor under test.

15. The tester of claim 13, wherein said electrical connection devices support a direct ground return through the case of the starter motor under test.

16. The tester of claim 13, wherein said electrical connection devices support a solenoid activation terminal separate from the battery and ground connections.

17. The tester of claim 13, wherein said electrical connection devices support testing the added function of starter motors equipped with an auxiliary ignition terminal separate from any power and solenoid activation terminals that may be present on such starter motors.

18. The tester of claim 13, wherein said electrical connection devices support testing starter motors used with separate solenoids.

19. The tester of claim 1, wherein said system supports evaluation of the condition of the start and hold coils and any contacts of starter motor solenoids.

20. The tester of claim 1, wherein a current sense circuit provides a measurement of the average motor current.

21. The tester of claim 1, wherein the detector circuit further comprises:

a resistor receiving input from the motor under test;

an isolating amplifier connected to the resistor with voltage developed across the resistor, including amplification and buffering from the isolating amplifier; and a filter connected to the isolating amplifier removing the direct current level and uncorrelated noise from the electrical circuit, yielding a series of signal pulses associated with the powering of successive armature windings in the motor under test.

22. The tester of claim 1, wherein the electrical circuit to apply power, further comprises:

a protection device receiving input from an alternating current power source and providing a protection function for the received power;

a filter providing electromagnetic interference filtering of the power from the protection device;

a power switching device controlling the power from the filter;

an alternating current to direct current device converting the power from the power switching device; and a second filter providing an electromagnetic interference filtering of the direct current from the alternating current to direct current device, providing power to the motor under test.

23. The tester of claim 1, wherein the detector circuit further comprises:

a signal processor receiving signal from a current sensor from a return of the current from the motor under test, the signal developed across the current sensor is subject to signal level adjustment and filtering from the signal processor to provide a predetermined magnitude;

an analog to digital converter receiving the signal form the signal processor and converting the signal from analog to digital;

a digital signal processor receiving the signal from the analog to digital converter and processing the signal for display; and an interface buffer providing information of the motor from a remote source to the digital signal processor for processing for display.

24. The tester of claim 1, wherein the detector circuit further comprises:
   a means for detection of pulsations in the motor under testing;
   a means for converting the pulsations to a numerical rate value; and
   a means for comparing the rates of the motor under test and a standard for the type of motor under test for display.

25. The tester of claim 1, wherein the mechanical clamping apparatus, the electrical circuit, the detector circuit and display being integrated and housed in a single unit.

26. An apparatus for testing vehicle engine starter motors, comprising:
   a clamp restraining a motor under test from rotating during startup and slowdown;
   a power supply providing power to the starter motor at the level of a compatible vehicle;
   a detector module receiving the current output form a starter motor under test, further comprising:
      a first module sensing the current from the motor or from the magnetic field outside the motor;
      a second module converting the signal from the first module for processing; and
      a third module receiving input from the second module and converting the input received to a spin rate, and comparing the spin rate with standard spin rates of the motor received from an external input;
   a data storage capability allowing entered data characterizing a plurality of starter motor types to be retained and communicatively linked to the external input;
   a data selection device allowing a single starter motor type to be selected from entered data; and
   a display to report the information outputted from the detector module.

27. The apparatus of claim 26, further comprising a driver circuit providing additional functions in the motor under test to be exercised with excitation and loads of the vehicle adapted for the motor.

* * * * *